(12) United States Patent
Eroz et al.

(10) Patent No.: US 8,429,490 B2
(45) Date of Patent: *Apr. 23, 2013

(54) METHOD FOR A GENERAL NEAR OPTIMAL TURBO CODE TRELLIS TERMINATION

(75) Inventors: Mustafa Eroz, Germantown, MD (US); A. Roger Hammons, Jr., North Potomac, MD (US)

(73) Assignee: DTVG Licensing, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/475,572

(22) Filed: May 18, 2012

(65) Prior Publication Data

US 2012/0233519 A1    Sep. 13, 2012

Related U.S. Application Data

(63) Continuation of application No. 11/981,185, filed on Oct. 31, 2007, now Pat. No. 8,201,048, which is a continuation of application No. 11/051,605, filed on Feb. 4, 2005, now Pat. No. 7,487,431, which is a continuation of application No. 10/023,509, filed on Dec. 18, 2001, now Pat. No. 6,862,706, which is a continuation of application No. 09/378,625, filed on Aug. 20, 1999, now Pat. No. 6,332, 209.

(60) Provisional application No. 60/098,111, filed on Aug. 27, 1998.

(51) Int. Cl.
  *H03M 13/29*    (2006.01)
(52) U.S. Cl.
  USPC .......................................................... 714/755
(58) Field of Classification Search .................... 714/755
  See application file for complete search history.

(56) References Cited

U.S. PATENT DOCUMENTS 5,687,095 A    11/1997  Haskell et al.
5,721,745 A     2/1998  Hladik et al.
(Continued)

FOREIGN PATENT DOCUMENTS

DE    19520987 A1   12/1996
DE    19736653 C1    8/1997
(Continued)

OTHER PUBLICATIONS

EPO Communication dated Jan. 31, 2011 in European divisional Patent Application No. 09075131.4 filed Aug. 20, 1999 by Mustafa Eroz et al.

(Continued)

*Primary Examiner* — Stephen M Baker

(57) ABSTRACT

A method of terminating two or more constituent encoders of a turbo encoder employing a turbo code, comprising the steps of: generating tail input bits at each of two or more constituent encoders, including deriving the tail input bits from each of the two or more constituent encoders separately from a contents of shift registers within each of the two or more constituent encoders, after an encoding of information bits by the two or more constituent encoders; puncturing one or more tail output bits such that 1/R output tail bits are transmitted for each of a plurality of trellis branches, wherein R is a turbo code rate employed by the turbo encoder during an information bit transmission. In yet another variation, the step of puncturing the tail output bits further comprises the step of: transmitting, during trellis termination, the tail output bits, only if they are sent from an output branch of one of the two or more constituent encoders that are used during information bit transmission.

9 Claims, 1 Drawing Sheet

U.S. PATENT DOCUMENTS

| | | | |
|---|---|---|---|
| 5,742,612 | A | 4/1998 | Gourgue et al. |
| 5,907,582 | A | 5/1999 | Yi |
| 5,910,182 | A | 6/1999 | Dent et al. |
| 5,944,850 | A | 8/1999 | Chouly et al. |
| 5,970,085 | A | 10/1999 | Yi |
| 5,978,414 | A | 11/1999 | Nara |
| 5,983,384 | A | 11/1999 | Ross |
| 5,987,067 | A | 11/1999 | Song |
| 5,996,104 | A | 11/1999 | Herzberg |
| 6,023,783 | A | 2/2000 | Divsalar et al. |
| 6,088,387 | A | 7/2000 | Gelblum et al. |
| 6,094,427 | A | 7/2000 | Yi |
| 6,289,486 | B1 | 9/2001 | Lee et al. |
| 6,334,197 | B1 | 12/2001 | Eroz et al. |
| 6,339,834 | B1 | 1/2002 | Crozier et al. |
| 6,347,385 | B1 | 2/2002 | Cui et al. |
| 6,370,669 | B1 | 4/2002 | Eroz et al. |
| 6,430,722 | B1 | 8/2002 | Eroz et al. |
| 6,519,732 | B1 | 2/2003 | Li |
| 6,530,059 | B1 | 3/2003 | Crozier et al. |
| 6,665,829 | B2 | 12/2003 | Eroz et al. |
| 7,779,329 | B2 * | 8/2010 | Eroz et al. ............... 714/755 |
| 7,827,465 | B2 * | 11/2010 | Eroz et al. ............... 714/755 |
| 2002/0087923 | A1 | 7/2002 | Eroz et al. |
| 2002/0166093 | A1 | 11/2002 | Eroz et al. |
| 2003/0041297 | A1 | 2/2003 | Eroz et al. |
| 2003/0051205 | A1 | 3/2003 | Eroz et al. |

FOREIGN PATENT DOCUMENTS

| | | |
|---|---|---|
| EP | 0300139 A2 | 1/1989 |
| EP | 0300139 A3 | 5/1990 |
| EP | 0952673 A1 | 10/1999 |
| JP | 62-190932 A | 8/1987 |
| JP | 7-202851 A | 8/1995 |
| JP | 11-068734 | 3/1999 |
| WO | 96/37050 A1 | 11/1996 |
| WO | 98/48517 A1 | 10/1998 |
| WO | 99/07076 A2 | 2/1999 |
| WO | 00/13323 A1 | 3/2000 |
| WO | 00/41343 A1 | 7/2000 |
| WO | 00/48353 A1 | 8/2000 |

OTHER PUBLICATIONS

EPO Communication dated Jun. 18, 2010 in European divisional Patent Application No. 04011909.1 filed May 19, 2004 (divisional of European Patent Application No. 99943834.4) by Mustafa Eroz et al.

EPO extended European Search Report dated Jan. 25, 2010 in European Patent Application No. 09075131.4 filed Aug. 20, 1999 (parent filing date of European Patent Application No. 99943834.4, now EP Patent 1050110) by Mustafa Eroz et al.; 6 pages.

Notice of Allowance dated Feb. 4, 2010 in U.S. Appl. No. 11/980,921, filed Oct. 31, 2007 by Mustafa Eroz et al.

EPO Communication dated Dec. 3, 2009 in European divisional Patent Application No. 04011909.1 filed Aug. 20, 1999 (parent filing date of EP Patent Application No. 99943834.4, now EP Patent No. 1050110) by Mustafa Eroz et al.

Non-final Office action dated Oct. 14, 2009 in U.S. Appl. No. 11/980,914, filed Oct. 31, 2007 by Mustafa Eroz et al.

Non-final Office action dated Oct. 14, 2009 in U.S. Appl. No. 11/980,921, filed Oct. 31, 2007 by Mustafa Eroz et al.

Blackert, W.J.; Hall, E.K.; Wilson, S.G.; "Turbo Code Termination and Interleaver Conditions"; Electronics Letters; vol. 31, No. 24; Nov. 1995; pp. 2082-2084.

Non-final Office action dated Mar. 24, 2009 in U.S. Appl. No. 11/980,921, filed Oct. 31, 2007 by Mustafa Eroz et al.

Non-final Office action dated Mar. 24, 2009 in U.S. Appl. No. 11/980,914, filed Oct. 31, 2007 by Mustafa Eroz et al.

EPO Communication dated Jul. 7, 2008 in European counterpart Application No. 04076516.6 corresponding to U.S. Appl. No. 09/378,625, filed Aug. 20, 1999, now issued Dec. 18, 2001 as US Patent No. 6,332,209.

EPO Communication dated Apr. 11, 2008 in European Patent Application No. 04076513.3, a divisional of European Patent Application No. 99943834.4 corresponding to U.S. Appl. No. 09/378,625, filed Aug. 20, 1999, now issued as US Patent No. 6,332,209.

Ho, Mark S.C. et al.; "Improving the Constituent Codes of Turbo Encoders"; IEEE Globecom 1998; Globecom 1998 The Bridge to Global Integration; Sydney, Australia; Nov. 8-12, 1998.

Andersen, Jakob Dahl; Zyablov, Viktor V.; "Interleaver Design for Turbo Coding"; Proceedings International Symposium on Turbo Codes; Brest, France; Sep. 1997.

Divsalar, D. et al.; "Multiple Turbo Codes"; Proceedings of the Military Communications Conference (Milcom); San Diego; No. 6-8; 1995; vol. 1; Nov. 6, 1995; Institute of Electrical and Electronics Engineers; ISBN XP-000580788.

Divsalar, D. et al.; "Turbo Codes for PCS Applications"; Jun. 18, 1995; pp. 54-59; XP-000532968.

Divsalar, D. et al.; "Effective Free Distance of Turbo Codes"; Electronics Letters; vol. 32, No. 5; Feb. 29, 1996; pp. 445-446.

Divsalar, D. et al.; "On the Design of Turbo Codes"; TDA Progress Report 42-123; Nov. 15, 1995; pp. 99-121.

Lee, Lin-Nan et al., "Turbo Code and Its Performance", TIA TR45.5.4, Dec. 8, 1997.

Lee, Lin-Nan et al., "Third Generation Wireless Technologies-Expectations and Realities", Ninth IEEE International Symposium on Personal, Indoor and Mobile Radio Communications (Cat. No. 98th 8361), Proceedings of Ninth International Symposium on Personal, Indoor and Mobile Radio Communications (PIMRC '98), Boston, MA, USA, Sep. 8-11, 1998, pp. 79-83, vol. 1, 1998 New York, NY USA, IEEE USA ISBN.

Benedetto, S. et al., "Unveiling Turbo Codes: Some Results on Parallel Concatenated Coding Schemes", IEEE Transactions on Information Theory, vol. 42, No. 2, Mar. 1, 1996, pp. 409-428, XP-002057508.

Benedetto, S. et al., "Design of Parallel Concatenated Convolutional Codes", IEEE Transactions on Communication, vol. 44, No. 5, May 1996.

Benedetto, S. et al., "Systematic Encoders for Convolutional Codes and Their Application to Turbo Codes", 0-7803-3336-5/96 IEEE, 1996, pp. 6-10.

Berrou et al., "Near Shannon Limit Error—Correcting Code and Decoding: Turbo Codes", May 23, 1993, pp. 1064-1070, XP-000371240.

Maric, "Class of Algebraically Constructed Permutations for Use in Pseudorandom Interleavers", Electronics Letters, vol. 30, No. 17, Aug. 18, 1994, pp. 1378-1379.

Eroz et al., "RTT Text for Turbo Codes", ETSI SMG2UMTS-L1, Oslo, Norway, Apr. 1, 1998.

Eroz et al., "FER and BER Comparisons of Turbo versus Convolutional Codes", ETSI SMG2UMTS-L1, Paris, France, Apr. 28, 1998.

Acikel, O.F. et al, "High Rate Turbo Codes for BPSK/QPSK Channels", ICC '98, 1998 IEEE International Conference on Communications, Jun. 7-11, 1998, pp. 422-427, vol. 1.

Riedel, S., "Symbol-by-Symbol MAP Decoding Algorithm for High-Rate Convolutional Codes that Use Reciprocal Dual Codes", IEEE Journal on Selected Areas in Communications, Vo. 16, No. 2, Feb. 1, 1998, pp. 175-185.

Rowitch, D.N. et al., "Rate Compatible Punctured Turbo (RCPT) Codes in a Hybrid FEC/ARQ System", 1997 IEEE Global Telecommunications Mini-Conference, vol. 4, Nov. 1999, pp. 55-59.

Chan et al, "An Adaptive Hybrid FEC/ARQ Protocol Using Turbo Codes", 1997 IEEE 6th International Conference on Universal Personal Communications, Oct. 1997, pp. 541-545.

Barbulescu et al., "Rate Compatible Turbo Codes", Electronics Letters, vol. 31, No. 7, Mar. 30, 1995, pp. 535-536.

LGIC, "Puncturing Algorithm for Turbo", 3GPP/TSG/RAN/WG1#4, TDOC 338/99, Apr. 19-20, 1999, pp. 1-6, Yokohama, Japan, p. 1, line 1—p. 6, last line, fig. 2, XP-002184254.

Blackert et al., "An Upper Bound on Turbo Code Fee Distance", ICC 1996, Jun. 1996, pp. 957-961.

Fei et al., "The Effects of Time Delay Spread on Turbo-TCM in a Wireless Communication Channel", 1997 IEEE 47th Vehicular Technology Conference, May 1997, pp. 334-338.

Reed, M. C. et al.; "Turbo-Code Termination Schemes and a Novel Alternative for Short Frames"; IEEE International Symposium on Personal, Indoor and Mobile Radio Communications; Oct. 15, 1996; pp. 354-358; XP002050626.

Japanese Office Communication dated Dec. 2, 2003 in Japanese counterpart application No. 2000-568190.

Japanese Office Communication dated Apr. 25, 2006 in Japanese divisional counterpart application No. 2004-159901.

Japanese Office Communication dated Dec. 19, 2006 in Japanese divisional counterpart application No. 2004-159901.

* cited by examiner

TURBO CODE ENCODER

METHOD FOR A GENERAL NEAR OPTIMAL TURBO CODE TRELLIS TERMINATION

CROSS-REFERENCE TO RELATED APPLICATIONS

This application is a continuation of U.S. application Ser. No. 11/981,185, filed Oct. 31, 2007, now U.S. Pat. No. 8,201,048, issued Jun. 12, 2012, which is a continuation of U.S. application Ser. No. 11/051,605, filed Feb. 4, 2005, now U.S. Pat. No. 7,487,431, issued Feb. 3, 2009, which is a continuation of U.S. application Ser. No. 10/023,509, filed Dec. 18, 2001, now U.S. Pat. No. 6,862,706, issued Mar. 1, 2005, which is a continuation of U.S. application Ser. No. 09/378,625, filed Aug. 20, 1999, now U.S. Pat. No. 6,332,209, issued Dec. 18, 2001, which claims benefit of U.S. Provisional Application Ser. No. 60/098,111, filed Aug. 27, 1998, the contents of all of which are hereby incorporated by reference herein in their entirety.

BACKGROUND OF THE INVENTION

The present invention relates to methods for terminating both of the constituent encoders of a turbo code and developing puncturing patterns applicable at a trellis termination stage that ensures the same number of transmitted bits for each trellis stage during the information bit transmission and trellis termination stages.

The process of forward and reverse link turbo encoding and decoding, specifically for Code Division Multiple Access (CDMA) communications channels, is thoroughly described in U.S. patent application Ser. No. 09/248,338, of Eroz, et al., for SETS OF RATE-COMPATIBLE UNIVERSAL TURBO CODES NEARLY OPTIMIZED OVER VARIOUS RATES AND INTERLEAVER DELAYS, filed Feb. 11, 1999, now U.S. Pat. No. 6,370,669, issued Apr. 9, 2002, and U.S. patent application Ser. No. 09/235,582, of Eroz, et al., for FORWARD ERROR CORRECTION SCHEME FOR DATA CHANNELS USING UNIVERSAL TURBO CODE, filed Jan. 22, 1999, now U.S. Pat. No. 6,430,722, issued Aug. 6, 2002, both of which are incorporated herein by reference.

In a convolutional encoding scheme, tail bits are inserted after information bits, to zero out all shift registers of an encoder. For feed forward encoders, tail bits are equal to zero. For feedback encoders the value of tail bits depend on the contents of the shift register current values.

A turbo encoder consists of a parallel concatenation of two (2) or more recursive (feedback) convolutional encoders. Because each constituent encoder processes the information bits in a different order due to a turbo interleaver, it is not possible to terminate all constituent encoders by the same tail bits.

A trellis termination method general enough to be used for a set of turbo codes with different code rates as in the third generation CDMA system is desirable. Included in the desirable general method is a method of puncturing tail bit sequences.

SUMMARY OF THE INVENTION

The present invention advantageously addresses the needs above as well as other needs by providing a method and apparatus for a general Turbo Code trellis termination which may be employed when a turbo encoder operates within a wide range of turbo code rates when transmitting information bits.

In its most general form, the invention can be characterized as a method of terminating two or more constituent encoders of a turbo encoder. The method comprises the steps of: generating tail input bits at each of two or more constituent encoders, including the step of deriving the tail input bits from each of the two or more constituent encoders separately from the contents of shift registers within each of the two or more constituent encoders, after an encoding of information bits by the two or more constituent encoders; and puncturing one or more tail output bits such that 1/R tail output bits are transmitted for each of a plurality of trellis stages, wherein R is a turbo code rate employed by the turbo encoder during the information bit transmission.

In yet another variation, the step of puncturing the one or more tail output bits further comprises the step of: transmitting, during trellis termination, the tail output bits only if they are sent from an output branch of one of the two or more constituent encoders that is used during information bit transmission.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENT

Figure 1:
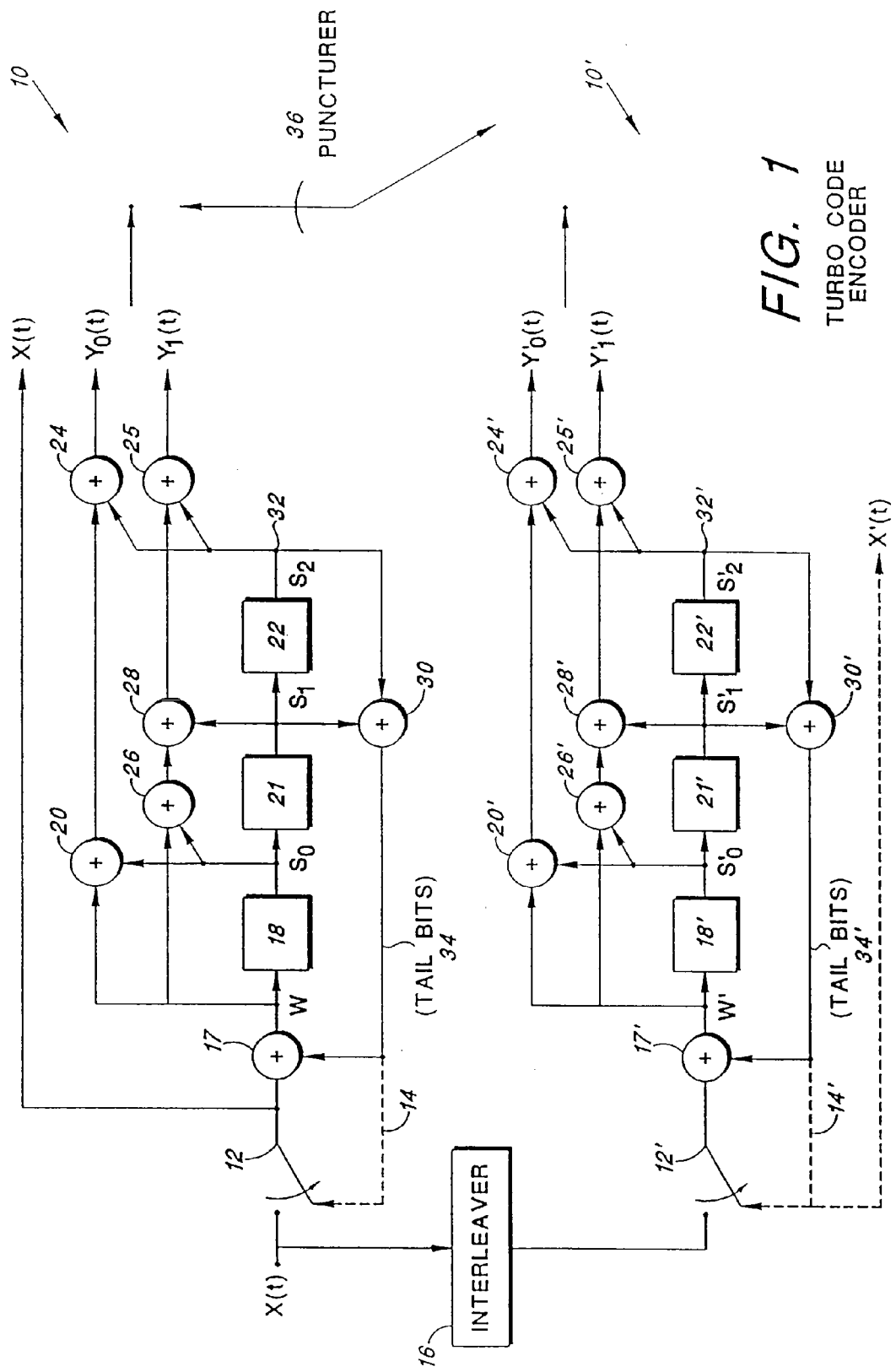
FIG. 1 is a block diagram of a turbo encoder with interleaved bits entering a second encoder, for use in accordance with one embodiment of the present invention.

The following description of the presently contemplated best mode of practicing the invention is not to be taken in a limiting sense, but is made merely for the purpose of describing the general principles of the invention. The scope of the invention should be determined with reference to the claims.

Referring to FIG. 1, an exemplary turbo code encoder is shown wherein one embodiment of a Turbo Code trellis termination design terminates one encoder 10 (a first encoder) while disabling another encoder 10' (a second encoder) and at a different time terminates the other encoder 10' (second encoder) while disabling the encoder 10 (first encoder).

The encoders (first and second encoders) 10, 10' of the turbo code encoder of FIG. 1 are constituent encoders configured in a parallel concatenation. It is well known in the art that a constituent encoder employ a configuration of modular adders 17, 20, 26, 28, 30, 24, and 25, and shift registers 18, 21, 22, coupled through nodes (such as node 32) to produce output bits, including tail output bits, $X(t)$, $Y_o(t)$, $Y_1(t)$, for example, depending upon the encoding scheme. FIG. 1 is just one example of such a parallel concatenation of constituent encoders, wherein an interleaver device (Inter leaver) 16 is employed between an input for $X(t)$ and the second encoder 10', and wherein additionally, a puncturer 36 is employed, switchably coupled to respective encoder outputs for each of the encoders (first and second encoders) 10, 10'. As described herein, tail input bits will mean the bits X, and X' in FIG. 1, and tail output bits will mean the bits X, X', $Y_o$, $Y_o'$, $Y_1$ or $Y_1'$. In other turbo encoders, there may be more than two constituent encoders. Each of the constituent encoders may utilize a fewer or greater number of shift registers than in FIG. 1.

In FIG. 1, after message bits $X(t)$ are encoded, a switch 12 is moved to a feedback position to allow the generation of three (3) consecutive tail input bits, in this example, generated from the contents of each of three shift registers 18, 21, and 22 (also referred to herein as a first shift register 18, a second shift register 21, and a third shift register 22). In general, a number of tail input bits $X(t)$, $X'(t)$ for terminating a constituent encoder is equal to a number of shift registers in that encoder.

At the end of each clock cycle, new tail input bits $X(t)$, $X'(t)$ are generated for zeroing out each respective shift register of the three shift registers, 18, 21 and 22.

In one embodiment of the invention the encoders 10, 10' are terminated simultaneously within three clock cycles, each with its own tail input bit $X(t)$, $X'(t)$. Alternatively, the first encoder 10 is first terminated while the second encoder 10' is disabled, followed by the second encoder 10' being terminated while the first encoder 10 is disabled.

In the variation with the encoders 10, 10' terminated at different times the encoders 10, 10' can be terminated in consecutive clock cycles, wherein six (6) consecutive clock cycle tail input bits $X(t)$, $X'(t)$, consecutively terminate both the encoders 10, 10'.

As can be seen from FIG. 1, a second tail input bit sequence 34' for terminating the second encoder 10' is fed back into the second encoder 10' through a switch 12' and circuit 14'. Tail input bits $X(t)$, $X'(t)$ are not interleaved by the turbo interleaver 16. Similarly, a tail input bit sequence 34 for terminating the first encoder 10 is fed back into the first encoder 10 through another switch 12 and another circuit 14.

The zeroing of the shift registers 18, 21, 22, prior to implementing a puncturing scheme per an embodiment of the invention, is triggered by a beginning and an ending tail input bit sequence $X(t)$, $X'(t)$, each sequence having a number n of tail input bits $X(t)$, $X'(t)$ equal to the number n of shift registers 18, 21, 22 or 18', 21, 22 coupled to each one of the encoders 10, 10'.

As with information and coded bits, tail output bits $X$, $Y_o$, $Y_1$, $X'$, $Y_o'$, $Y_1'$ are also punctured by the puncturer 36.

Table 1 indicates associated tail output bit puncturing patterns having indicator sequences (e.g., "111 000") identifying which bits to puncture and which bits to transmit. The indicator sequence, comprising "1"'s or "0"'s is selected in accordance with an encoder rate. In this notation, "1" indicates the tail output bit should be transmitted and "0" indicates that the tail output should be punctured. Certain entries in Table 1 are labeled "repeat", which means that transmitted bits are transmitted twice.

The tail input bit sequences 34, 34', which comprise tail input bits $X$, and $X'$, are generated after the encoders 10, 10' encode the information bits with the switches 12, 12' (FIG. 1), while the switches 12, 12' are in an up position. The first n/R tail output bits $X_1$, $Y_o$, $Y_1$, wherein n is the number of shift registers 18, 21, 22 or 18', 21', 22' per constituent encoder (n=3 in FIG. 1), and wherein R is a turbo code rate being employed, are generated by clocking the first encoder 10 n times with its switch 12 in the down position while the second encoder 10' is not clocked, and puncturing or repeating the resulting tail output bits $X_1$, $Y_o$, $Y_1$, $X'$, $Y_o'$, $Y_1'$ according to Table 1 below. The last n/R tail output bits $X'$, $Y_o'$, $Y_1'$ are generated by clocking the second encoder 10' n timer with its switch 12' in the down position while the first encoder 10 is not clocked, and puncturing or repeating the resulting tail output bits according to Table 1. These final output bits are denoted by $X'$, $Y_o'$ or $Y_1'$.

For rate ½ turbo codes, the tail output bits for each of a first n tail input bit (also referred to herein as "the beginning tail bit sequence $X(t)$") are $XY_0$, and the tail output bits for each of a last n tail bit periods (also referred to herein as "the ending tail bit sequence $X'(t)$") are $X'Y_0'$. For rate ⅓ turbo codes, the tail output bits for each of the first n tail input bits are $XXY_0$, and the tail output bits for each of the last n tail bits are $X'X'Y_o'$. For a rate ¼ turbo code, the tail output bits for each of the first n tail input bits are $XXY_0Y_1$ and the tail output bits for each of the last n tail input bits periods are $X'X'Y_0Y_1'$.

Tail inputs bits are not interleaved by the interleaver 16. They are added after the encoding of the information bits.

TABLE 1

| Puncturing Patterns for Tail Output Bits | | | |
| --- | --- | --- | --- |
| Rate | 1/2 | 1/3 | 1/4 |
| $X(t)$ | 111 000 | 111 000 | 111 000 |
| | | Repeat | Repeat |
| $Y_0(t)$ | 111 000 | 111 000 | 111 000 |
| $Y_1(t)$ | 000 000 | 000 000 | 111 000 |
| $X'(t)$ | 000 111 | 000 111 | 000 111 |
| | | Repeat | Repeat |
| $Y_0'(t)$ | 000 111 | 000 111 | 000 111 |
| $Y_1'(t)$ | 000 000 | 000 000 | 000 111 |

When employing Table 1 to design puncturing patterns for tail output bits, the row designation "Repeat" means that for a rate ⅓ or a rate ¼ turbo code, when transmitted, the bits X and X' are transmitted twice.

For a rate ½ turbo code, the puncturing table is read first from top to bottom, and then from left to right. For a rate ⅓ turbo code and a rate ¼ turbo code, the puncturing table is read first from top to bottom, repeating $X(t)$ and $X'(t)$, and then from left to right.

The puncturing patterns in Table 1 are chosen so that:

(1) A number of transmitted tail output bits during trellis termination is 1/R for each trellis branch wherein R is the turbo code rate employed during information bit transmission. Advantageously, this condition ensures that the same turbo code rate is used for trellis termination as for information bit transmission.

(2) Only output branches of the encoders 10, 10' used during information bit transmission are used for trellis termination. For example, for rate ½ and rate ⅓ turbo coders, only $X(t)$, $X'(t)$, $Y_0(t)$ and $Y'_o(t)$ are transmitted during information bit transmission; $Y_1(t)$ and $Y'_1(t)$ are always punctured. Therefore, only $X(t)$, $X'(t)$, $Y_0(t)$ and $Y'_o(t)$ are transmitted during the trellis termination stage, as well. Advantageously, therefore, if a manufacturer only wanted to implement a rate ½ and encoder, such a manufacturer would only have to implement transmissions of bits from branches $X$, $Y_0$ or $X'$, $Y_0'$.

(3) In order to meet conditions (1) and (2), it may require repetition of some tail output bits during trellis termination. That is, to both keep the turbo code rate the same, and to only use output branches used in information bit transmission, it may be necessary to repeat one or more of the tail bits for each encoder 10, 10' in order to keep the turbo code rate the same.

In the preferred embodiment illustrated by Table 1, $X(t)$ and $X'(t)$ are selected to be repeated in both the turbo code rate ⅓ and rate ¼ cases. Table 1 may also be employed irrespective of whether the encoders 10, 10' are terminated concurrently or non-concurrently.

Alternative embodiments are envisioned, in keeping within the spirit of the invention wherein another tail output bit is selected to be repeated, such as, for example that corresponding to $Y_0(t)$ and $Y_0'(t)$. Alternatively, where a code rate lower than ¼ is employed it may be necessary to repeat more than one tail output bit per encoder 10, 10', in which case an additional tail bit besides $X(t)$ may be repeated, such as repeating $X(t)$ and $Y_0(t)$ or repeating $X(t)$ twice or any combination whatsoever.

While the invention herein disclosed has been described by means of specific embodiments and applications thereof, numerous modifications and variations could be made thereto by those skilled in the art without departing from the scope of the invention set forth in the claims.

The invention claimed is:

1. A method of turbo encoding, the method comprising:
   encoding information bits input to a first constituent encoder;
   interleaving the information bits;
   encoding the interleaved information bits input to a second constituent encoder; and
   performing trellis termination by taking tail bits after the information bits are encoded,
      wherein each of the first and second constituent encoders includes three shift registers, and
      wherein a first three tail bits are used to terminate the first constituent encoder while the second constituent encoder is disabled and a last three tail bits are used to terminate the second constituent encoder while the first constituent encoder is disabled.

2. The method of claim 1, wherein a coding rate for turbo encoding is ⅓.

3. The method of claim 1, wherein the tail bits are padded after encoding the information bits.

4. The method of claim 1, wherein the three shift registers are connected in series.

5. A turbo encoder comprising:
   a first constituent encoder configured to encode information bits;
   an interleaver configured to interleave the information bits; and
   a second constituent encoder configured to encode the interleaved information bits,
      wherein trellis termination is performed by taking tail bits after the information bits are encoded,
      wherein each of the first and second constituent encoders includes three shift registers, and
      wherein a first three tail bits are used to terminate the first constituent encoder while the second constituent encoder is disabled and a last three tail bits are used to terminate the second constituent encoder while the first constituent encoder is disabled.

6. The turbo encoder of claim 5, wherein a coding rate for turbo encoding is ⅓.

7. The turbo encoder of claim 5, wherein the tail bits are padded after encoding the information bits.

8. The turbo encoder of claim 5, wherein the three shift registers are connected in series.

9. A turbo decoder comprising:
   a decoder configured to decode turbo-encoded data with a coding rate of ⅓, the turbo-encoded data including encoded information bits and tail bits,
   wherein the encoded information bits are turbo encoded by a first constituent encoder and a second constituent encoder which are terminated by performing trellis termination,
   wherein each of the first and second constituent encoder includes three shift registers connected in series, and
   wherein a first three tail bits are used to terminate the first constituent encoder while the second constituent encoder is disabled and a last three tail bits are used to terminate the second constituent encoder while the first constituent encoder is disabled.

* * * * *